United States Patent
Chou et al.

(10) Patent No.: US 8,324,038 B2
(45) Date of Patent: *Dec. 4, 2012

(54) METHOD OF REMOVING A SPACER, METHOD OF MANUFACTURING A METAL-OXIDE-SEMICONDUCTOR TRANSISTOR DEVICE, AND METAL-OXIDE-SEMICONDUCTOR TRANSISTOR DEVICE

(75) Inventors: Pei-Yu Chou, Tainan County (TW); Shih-Fang Tzou, Hsinchu (TW); Jiunn-Hsiung Liao, Tainan Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 241 days.

This patent is subject to a terminal disclaimer.

(21) Appl. No.: 12/275,181

(22) Filed: Nov. 20, 2008

(65) Prior Publication Data

US 2009/0075441 A1    Mar. 19, 2009

Related U.S. Application Data

(63) Continuation of application No. 11/531,260, filed on Sep. 12, 2006, now Pat. No. 7,517,766.

(51) Int. Cl.
*H01L 21/336* (2006.01)
*H01L 21/8234* (2006.01)

(52) U.S. Cl. .................. 438/197; 257/E21.215; 257/288

(58) Field of Classification Search .................. 438/303, 438/197, 684; 257/288, E21.215, E21.409
See application file for complete search history.

(56) References Cited

U.S. PATENT DOCUMENTS

| 4,908,326 | A | 3/1990 | Ma |
| 6,004,852 | A * | 12/1999 | Yeh et al. ................ 438/303 |
| 6,632,745 | B1 | 10/2003 | Yap |
| 6,975,006 | B2 | 12/2005 | Huang |
| 7,179,715 | B2 * | 2/2007 | Chiang et al. ............. 438/303 |
| 2004/0212095 | A1 | 10/2004 | Ferreira |
| 2006/0088990 | A1 | 4/2006 | Menon |
| 2006/0148157 | A1 | 7/2006 | Tao |
| 2006/0216918 | A1 | 9/2006 | Chiang |
| 2007/0077773 | A1 | 4/2007 | Frohberg |
| 2007/0111416 | A1 | 5/2007 | Huang |

FOREIGN PATENT DOCUMENTS

| TW | I221626 | 10/2004 |
| TW | I228282 | 2/2005 |
| TW | I235435 | 7/2005 |
| TW | I243450 | 11/2005 |
| TW | I260042 | 8/2006 |

* cited by examiner

*Primary Examiner* — Tony Tran
(74) *Attorney, Agent, or Firm* — Winston Hsu; Scott Margo

(57) ABSTRACT

A method of removing a spacer, a method of manufacturing a metal-oxide-semiconductor transistor device, and a metal-oxide-semiconductor transistor device, in which, before the spacer is removed, a protective layer is deposited on a spacer and on a material layer (such as a salicide layer) formed on the source/drain region and a gate electrode, such that the thickness of the protective layer on the spacer is smaller than the thickness on the material layer, and thereafter, the protective layer is partially removed such that the thickness of the protective layer on the spacer is approximately zero and a portion of the protective layer is remained on the material layer. Accordingly, when the spacer is removed, the material layer may be protected by the protective layer.

8 Claims, 8 Drawing Sheets

METHOD OF REMOVING A SPACER, METHOD OF MANUFACTURING A METAL-OXIDE-SEMICONDUCTOR TRANSISTOR DEVICE, AND METAL-OXIDE-SEMICONDUCTOR TRANSISTOR DEVICE

CROSS REFERENCE TO RELATED APPLICATIONS

This is a continuation application of U.S. patent application Ser. No. 11/531,260 filed on Sep. 12, 2006, and the contents of which are included herein by reference.

BACKGROUND OF THE INVENTION

1. Field of the Invention

The present invention generally relates to the fabrication of semiconductor devices, and more particularly, to a method of removing a spacer in the manufacturing process of a metal-oxide-semiconductor transistor device.

2. Description of the Prior Art

For decades, chip manufacturers have made metal-oxide-semiconductor (MOS) transistors faster by making them smaller. As the semiconductor processes advance to very deep sub micron era such as 65-nm node or beyond, how to increase the driving current for MOS transistors has become a critical issue. In order to improve device performance, crystal strain technology has been developed. Crystal strain technology is becoming more and more attractive as a means for getting better performance in the field of CMOS transistor fabrication. Putting a strain on a semiconductor crystal alters the speed at which charges move through that crystal. Strain makes CMOS transistors work better by enabling electrical charges, such as electrons, to pass more easily through the silicon lattice of the gate channel.

Generally, strain in silicon can be induced in different ways: through stresses created by films in a form of poly stressor or contact etch stop layer (CESL) and structures that surround the transistor, called process-induced strain, or by employing a strained silicon wafer, where the top layer of silicon has typically been grown on top of a crystalline lattice that is larger than that of silicon. Most leading-edge chip manufacturers employ process-induced stress in some form in production today, typically tensile nitrides to improve NMOS device performance. As known in the art, tensile stress improves electron mobility and compressive stress improves hole mobility.

Conventional MOS (metal-oxide-semiconductor) device fabrication utilizes a technique of building material spacers to help control and define the implantation of dopants in the source and drain regions of the MOS. A conventional NMOS semiconductor device is schematically illustrated in FIG. 1. The conventional NMOS transistor device generally includes a semiconductor substrate generally comprising a silicon layer 16 having a source 18 and a drain 20 separated by a channel region 22. Ordinarily, the source 18 and drain 20 further border a shallow-junction source extension 17 and a shallow-junction drain extension 19, respectively. A thin dielectric layer 14 separates a gate electrode 12, generally comprising polysilicon, from the channel region 22. The source 18 and drain 20 are N+ regions having been doped by arsenic, antimony or phosphorous. The channel region 22 is generally boron doped. A silicon nitride spacer 32 is formed on sidewalls of the gate electrode 12. A liner 30, generally comprising silicon dioxide, is interposed between the gate electrode 12 and the silicon nitride spacer 32. A metal silicide layer 42 is selectively formed on the exposed silicon surface of the device. The process known as self-aligned silicide (salicide) process has been widely utilized to fabricate metal silicide materials, in which a source/drain region is first formed, a metal layer comprised of cobalt, titanium, or nickel is disposed on the source/drain region and the gate structure, and a rapid thermal process (RTP) is performed to react the metal layer with the silicon contained within the gate structure and the drain/source region to form a metal silicide for reducing the sheet resistivity ($R_s$) of the drain/source region.

In the conventional MOS fabrication technique, spacers are often used in the fabrication of LDD (lightly doped drain) regions to facilitate the different levels of doping for the drain/source regions and the LDD regions. The LDD region can be controlled by the lateral spacer dimension and the thermal drive cycle, and can be independent from the source and drain implant depth. In the 65 nm technology and beyond, the channel mobility enhancement can be further achieved by deposition of a highly strained dielectric layer after spacer removal. However, removing the spacer, especially spacer SiN (silicon nitride), is critical because removal can damage adjacent structures, such as the metal silicide layer, the gate, and the underlying silicon substrate. As shown in FIG. 1, in the conventional technique, an etching process 34 is directly performed to remove the spacer after the metal silicide layer is accomplished. A dry etching, such as an etching using a carbon tetrafluoride gas mixed with oxygen gas and nitrogen gas, may be performed to remove silicon nitride. A wet etching, such as a hot $H_3PO_4$ process at a temperature of 160° C., may be performed to remove silicon nitride. However, this often leads to the erosion of metal silicide layer, and especially when the spacer is silicon nitride and the metal silicide layer is nickel silicide, nickel silicide is easily damaged in the etching process. Accordingly, the sheet resistivity, one item in the wafer acceptance test (WAT), is harmfully affected.

Therefore, there is a need for a better method to remove spacers and fabricate a metal-oxide-semiconductor transistor device to remove spacers formed in the manufacturing process and not to damage salicide layers.

SUMMARY OF THE INVENTION

An objective of the present invention is to provide a method of removing a spacer, a method of fabricating a metal-oxide-semiconductor transistor device, and a metal-oxide-semiconductor transistor device. In the method of the present invention, spacers can be removed without damage to adjacent structures, such as salicide layer.

According to the present invention, the method of removing a spacer comprises steps as follows. A substrate comprising an electrode, a spacer on at least one sidewall of the electrode, and a material layer on the surface or the top of the substrate and the electrode is provided. A deposition process is performed to deposit a protective layer on the material layer and the spacer, such that the protective layer has a first thickness on the spacer and a second thickness on the material layer, and the first thickness is less than the second thickness. A first etching process is performed to partially remove the protective layer, such that the protective layer on the spacer is substantially removed, and the protective layer on the material layer has a remained thickness. A second etching process is performed to remove the spacer, wherein the spacer has an etching selectivity with respect to the protective layer.

According to the present invention, the method of manufacturing a metal-oxide-semiconductor transistor device comprises steps as follows. An electrode is formed on a semiconductor substrate and a drain/source region is formed in the semiconductor substrate beside the electrode. A spacer is formed on at least one sidewall of the electrode. A process operation is performed on the semiconductor substrate using the spacer as a mask and forming a material layer on the surface or the top of the drain/source region and the electrode. A deposition process is performed to deposit a protective layer on the material layer and the spacer, such that the protective layer has a first thickness on the spacer less than a second thickness on the material layer. A first etching process is performed to partially remove the protective layer, such that the protective layer on the spacer is substantially removed, and the protective layer on the material layer has a remained thickness. A second etching process is performed to remove the spacer, wherein the spacer has an etching selectivity with respect to the protective layer. A contact etch stop layer is formed to cover the electrode and the drain/source region.

According to the present invention, the MOS transistor device comprises a semiconductor substrate, an electrode on the semiconductor substrate, a drain/source region in the semiconductor substrate beside the electrode, a material layer on the surface or the top of the drain/source region and the electrode, a protective layer on the material layer, and a contact etch stop layer covering the electrode and the drain/source region.

In the present invention, a protective layer is deposited on the material layer (such as a salicide layer) and a spacer before the spacer is removed. The protective layer has a thickness on the spacer less than a thickness on the material layer, such that after the protective layer is partially removed using an etching process, the resulting thickness of the protective layer on the spacer is approximately zero, and the protective layer on the material layer has a remained non-zero thickness. Accordingly, when the spacer is removed using an etching process, the spacer can be easily removed by selecting an etchant having a high etching selectivity to the spacer without damaging the material layer (such as a salicide layer) since the material layer is protected by the remained protective layer. This feature is especially beneficial for the manufacturing of strained silicon transistor devices.

These and other objectives of the present invention will no doubt become obvious to those of ordinary skill in the art after reading the following detailed description of the preferred embodiment that is illustrated in the various figures and drawings.

DETAILED DESCRIPTION

Please refer to FIGS. 2-7 showing schematic cross-sectional diagrams illustrating one embodiment of the method of manufacturing a MOS transistor device in accordance with one embodiment of the present invention, wherein like number numerals designate similar or the same parts, regions or elements. It is to be understood that the drawings are not drawn to scale and are served only for illustration purposes.

Figure 1:
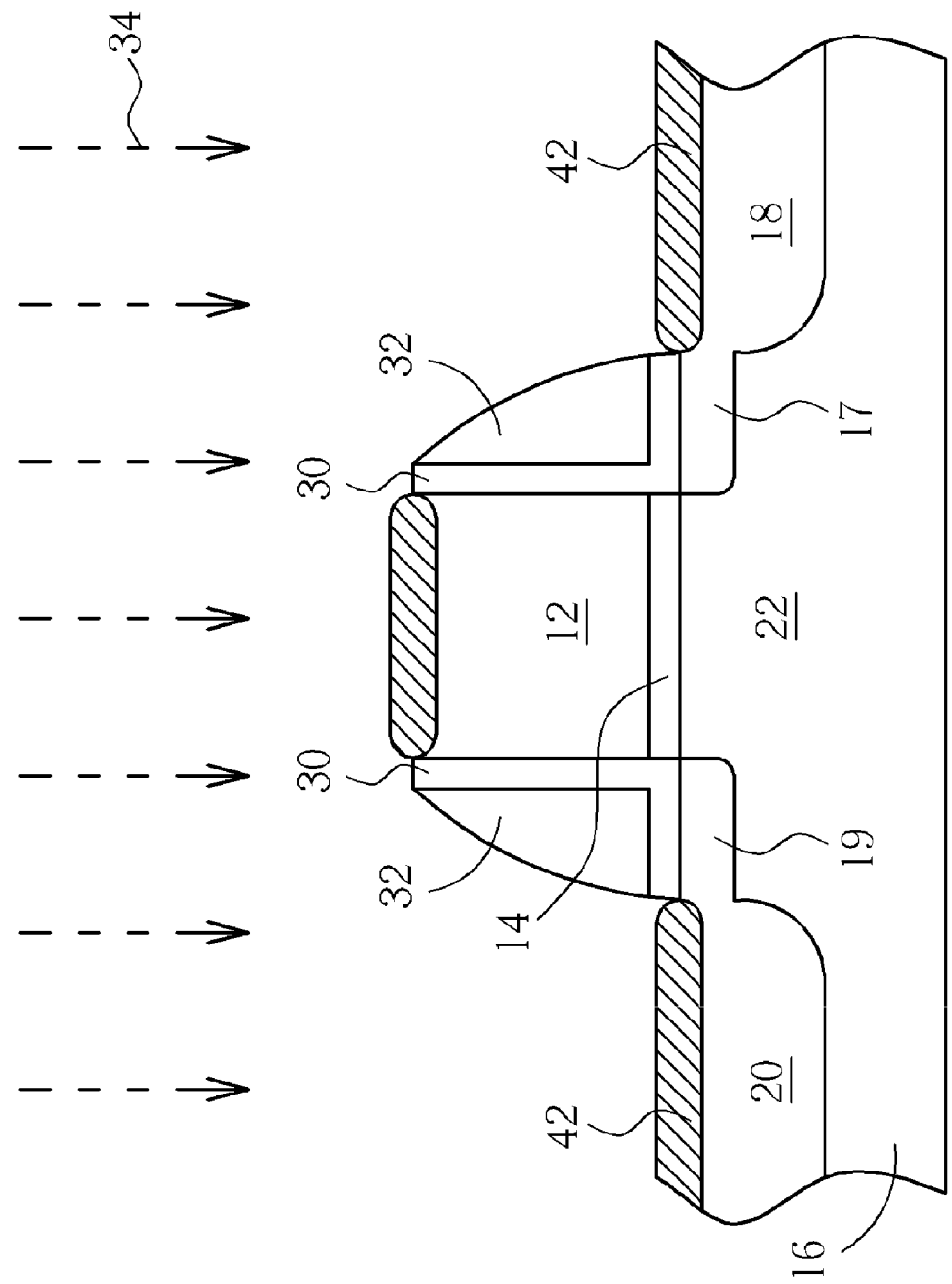
FIG. 1 is a schematic cross-sectional diagram illustrating a step of removing spacers in a conventional manufacturing method for a MOS transistor device.
Figure 2:
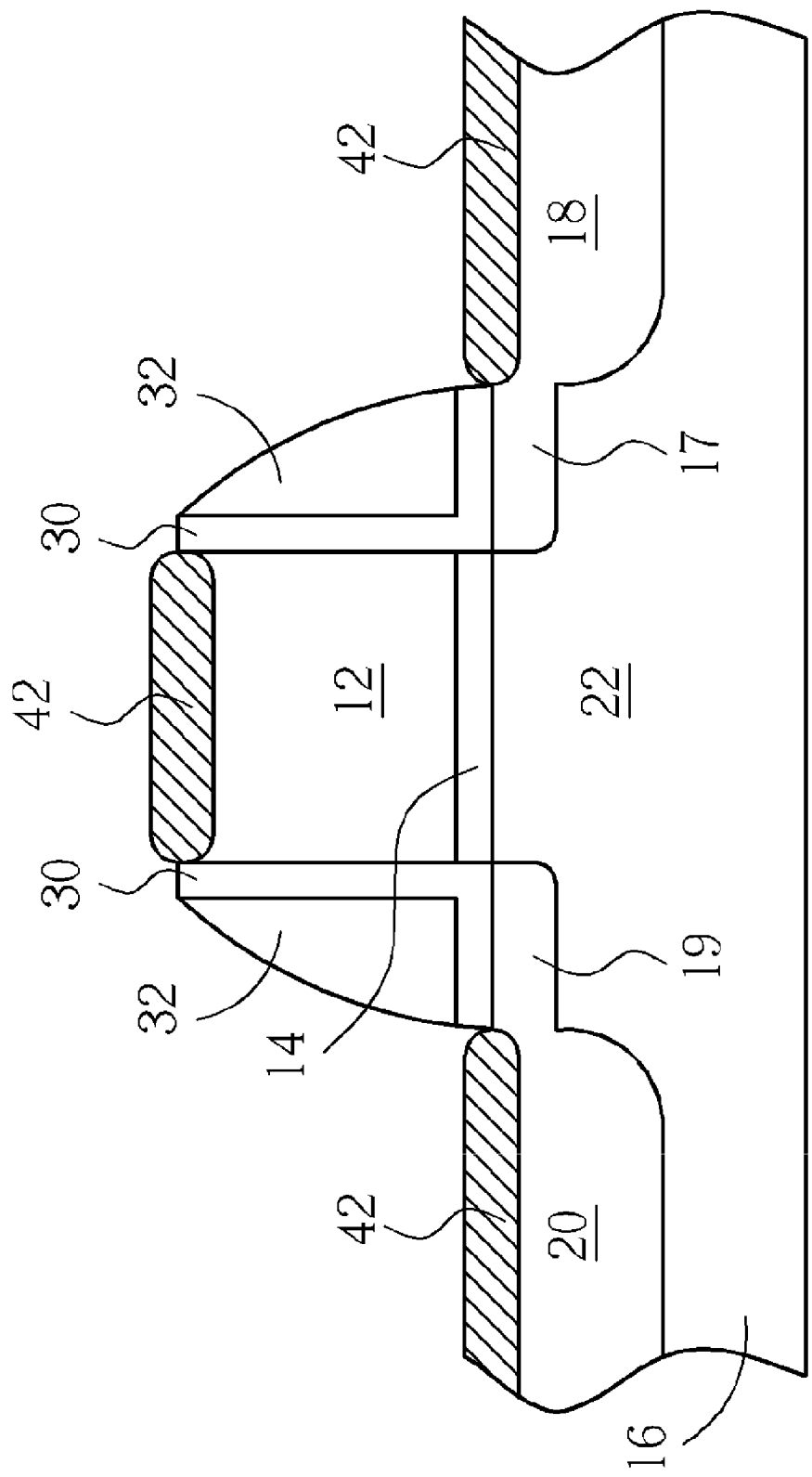
FIGS. 2-7 are schematic cross-sectional diagrams illustrating one embodiment of the manufacturing method for a MOS transistor device according to the present invention.

The present invention pertains to a method of manufacturing MOS transistor devices, such as NMOS, PMOS, and CMOS devices of integrated circuits. As shown in FIG. 2, a semiconductor substrate generally comprising a silicon layer 16 is prepared. The semiconductor substrate may be a silicon substrate or a silicon-on-insulator (SOI) substrate, but not limited thereto. An electrode, such as a gate electrode 12, is formed on the semiconductor substrate. A shallow-junction source extension 17 and a shallow-junction drain extension 19 may be formed in the silicon layer 16 beside the gate electrode 12. The source extension 17 and the drain extension 19 are separated by a channel 22.

A gate dielectric layer 14 may be formed to separate the gate electrode 12 from the channel 22. The gate electrode 12 generally comprises polysilicon. The gate dielectric layer 14 may be made of silicon dioxide. However, in another case, the dielectric layer 14 may be made of high-k materials known in the art. Subsequently, a spacer 32 comprising silicon nitride is formed on sidewalls of the gate electrode 12. A liner 30, such as silicon dioxide, may be interposed between the spacer 32 and the gate electrode 12. The liners 30 are typically L shaped and have a thickness of about 30-120 angstroms. The liner 30 may further comprise an offset spacer that is known in the art and is thus omitted in the drawings.

After forming the silicon nitride spacer 32, a source region 18 and a drain region 20 may be further formed in the semiconductor substrate by an ion implantation process carried out by doping dopant species, such as N type dopant species (such as arsenic, antimony or phosphorous) for making an NMOS or P type dopant species (such as boron) for making a PMOS, into the silicon layer 16. After the source/drain doping, the substrate may be subjected to an annealing and/or activation thermal process that is known in the art.

A material layer, such as a metal silicide layer 42 is formed on the gate electrode 12, on the exposed source region 18 and on the exposed drain region 20. The metal silicide layer 42 may be formed using the process known as self-aligned silicide (salicide) process, in which, after a source/drain region is formed, a metal layer comprising nickel is disposed on the source/drain region and the gate structure, and a rapid thermal process (RTP) is performed to react the metal layer with the silicon contained within the gate structure and the source/drain region to form a metal silicide. The temperature for RTP may be in the range of 700° C. to 1000° C.

Figure 3:
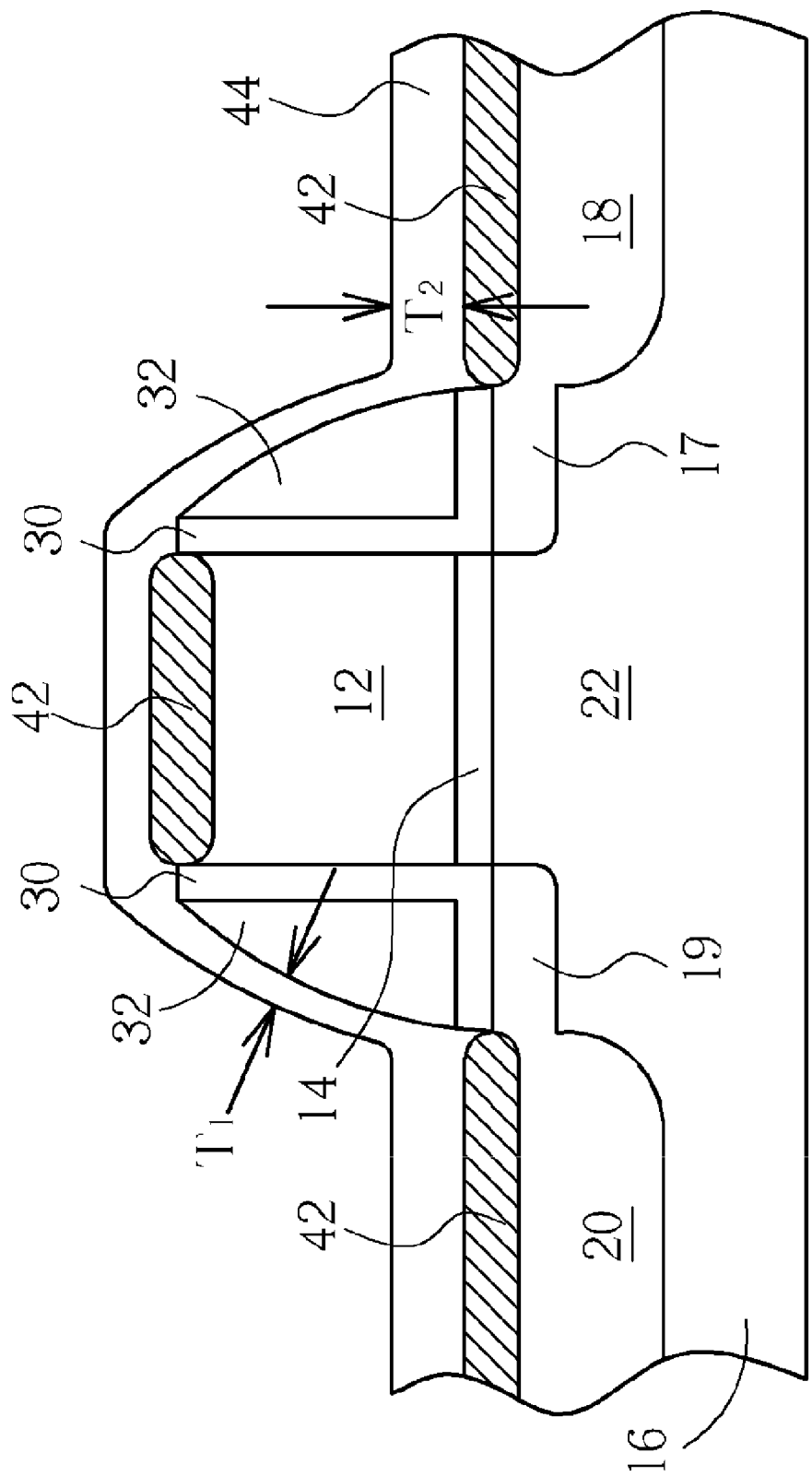
Figure 4:
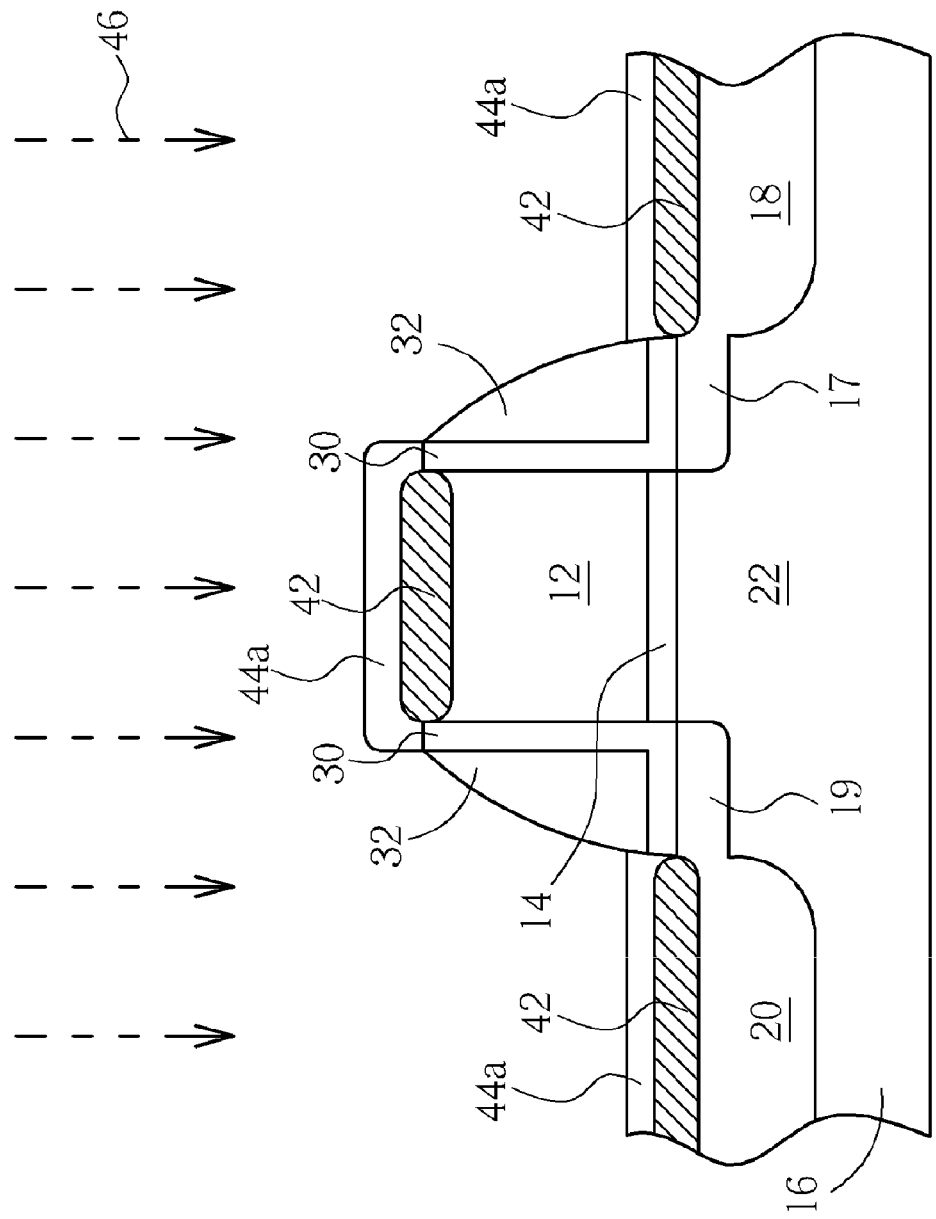

Subsequently, as shown in FIG. 3, a protective layer 44 is formed on the surface or the top of the metal silicide layer 42, the spacer 32, and the gate electrode 12, such that the protective layer 44 has a thickness on the spacer 32 less than a thickness on the metal silicide layer 42. For example, $T_1$ is smaller than $T_2$, as shown in FIG. 3, and preferably $T_1/T_2 \leq 0.9$. The material for the protective layer is selected in accordance with the material of the spacer; thereby the etching rates for the protective layer and the spacer are different. For example, when the spacer comprises silicon nitride, silicon oxide can be used to form the protective layer, and when the spacer comprises a silicon oxide-silicon nitride-silicon oxide (ONO) layer, silicon nitride can be used to form the protective layer. The protective layer may be formed by, for example, but not limited to, a plasma-enhanced chemical vapor deposition (PE CVD) process, a SILPE Base process using $SiH_4$ gas as a main reactant gas, or a high-density-plasma chemical vapor deposition (HDP CVD) process. With the non-uniform step coverage properties for the deposition, or further the control for the flow rate or the application of bias, a protective layer having a thickness on the spacer less than a thickness on the lateral top plane of the semiconductor substrate and the gate electrode can be attained. For example, but not limited to, a PEOX film may be formed using a SILPE Base process at 400° C. under 7 torr using 30 sccm of SiH$_4$, 1200 sccm of N$_2$O, and 12000 sccm of He for 9.5 sec, and the resulting PEOX film may have a thickness of about 70 Å on the spacer and a thickness of about 95 Å on the metal silicide layer.

Thereafter, an etching process (not shown), such as an anisotropic or isotropic dry or wet etching, is performed to remove partial thickness of the protective layer 44. Since the thickness of the protective layer 44 on the spacer 32 is less than that on the metal silicide layer 42, the protective layer located on the spacer 32 is easily almost completely removed (to a thickness of zero) during the etching process while there is still certain thickness of the protective layer remained on the metal silicide layer 42, as the protective layer 44a shown in FIG. 4. The protective layer 44a will serve as a hard mask to protect the metal silicide layer 42 in a subsequent spacer removal process. When dry etching, for example, is used for partially removing the protective layer 44, it may be performed at 45 degrees to obtain an increased etching rate for the protective layer located on the spacer. In the case mentioned above that the PEOX film has a thickness of about 70 Å on the spacer and a thickness of about 95 Å on the metal silicide layer 42, the protective layer remained on the metal silicide layer 42 after the partial removal process may have a thickness of about 20 Å.

Thereafter, an etching process 46 is performed to remove a spacer 32 by utilizing, for example, dry etching or wet etching. The etching recipe used preferably has a higher etching selectivity with respect to the spacer. For example, when the protective layer is silicon oxide, and the surface of the spacer comprises silicon nitride, the etching recipe may be a conventional one having a high etching selectivity with respect to silicon nitride; when the protective layer is silicon nitride, and the surface of the spacer comprises silicon oxide, the etching recipe may be a conventional one having a high etching selectivity with respect to silicon oxide; and the etching recipe may be further regulated. As such, the protective layer 44a may serve a function of protection to the metal silicide layer 42, and accordingly, during the spacer 32 is removed, damage to the metal silicide layer 42 can be reduced.

Figure 5:
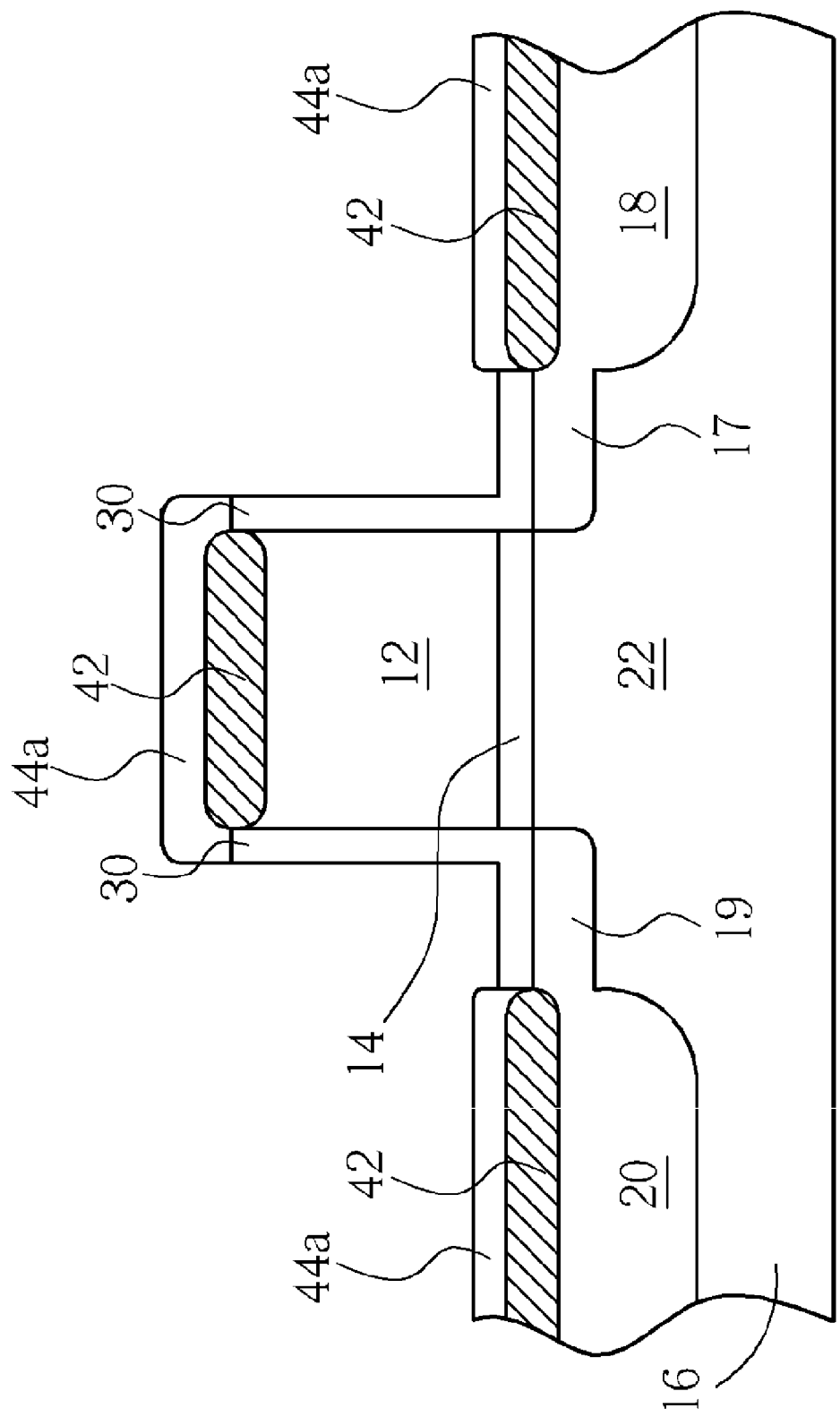

As shown in FIG. 5, after the spacer 32 is stripped away, leaving the L-shaped liner 30 on the sidewalls of the gate electrode and the protective layer 44a on the metal silicide layer 42. The liner 30 is not limited to the L shape. A mild etching process may be performed to slightly etch the liner for reducing the thickness. In other embodiments, the liner may be completely stripped away. The thickness of the liner may be between about 0 and 500 angstroms. The protective layer 44a may be left in the device structure or be removed.

Figure 6:
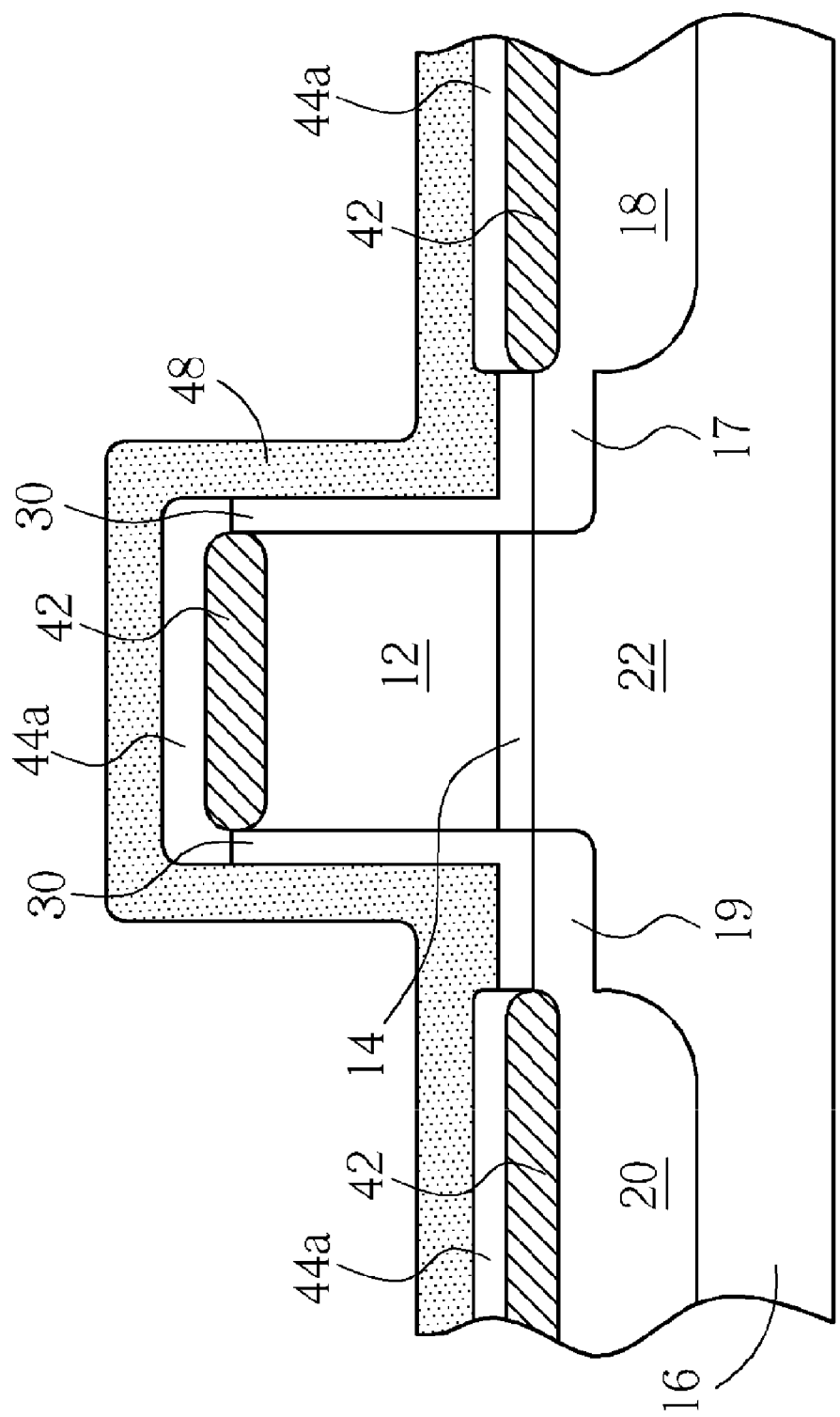

FIG. 6 shows an embodiment in which the protective layer 44a is not removed. As shown in FIG. 6, the resulting substrate may be subsequently processed as desired in the strained silicon technique or other semiconductor manufacturing processes after the spacers 32 are removed. For example, a contact etch stop layer 48 may be formed on the semiconductor substrate, such as a conformal silicon nitride cap layer preferably with a thickness of about 200 to 2000 angstroms. The silicon nitride cap layer borders the liner 30 on the sidewalls of the gate electrode 12 of the transistor device and combines with the protective layer 44a. The contact etch stop layer 48 may be deposited in a compressive-stressed status (for example, −0.1 Gpa to −3 Gpa) for a PMOS or in a tensile-stressed status (for example, 0.1 Gpa to 3 Gpa) for an NMOS to render the channel region 22 a compressive strain or a tensile strain. The alteration of the stress status of the contact etch stop layer 48 may be accomplished by using a germanium ion implantation or by using other methods known to those skilled in the art.

Figure 7:
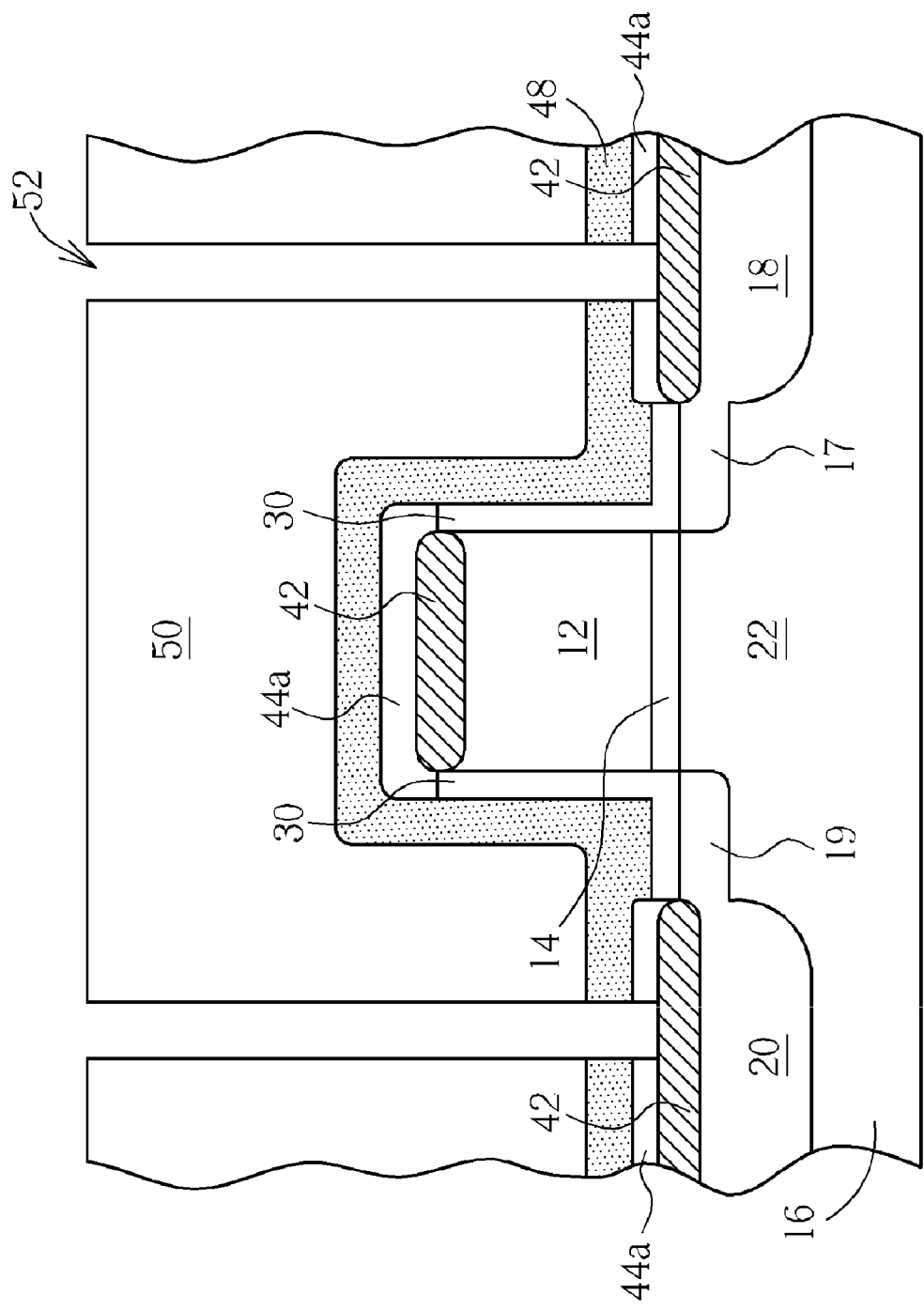

As shown in FIG. 7, an interlayer dielectric layer 50 is formed to cover the contact etch stop layer 48. Thereafter, an etching process, such as dry etching, is performed to form a hole (not shown) through the interlayer dielectric layer 50 to the contact etch stop layer 48. An etching process, such as wet etching, is further performed to etch through the contact etch stop layer 48 and the remained protective layer 44a in the hole to expose the metal silicide layer 42, that is, to form a contact hole 52 reaching to the drain/source region. The contact hole 52 may be filled with metal in a subsequent process to form a plug for electric connection.

Figure 8:
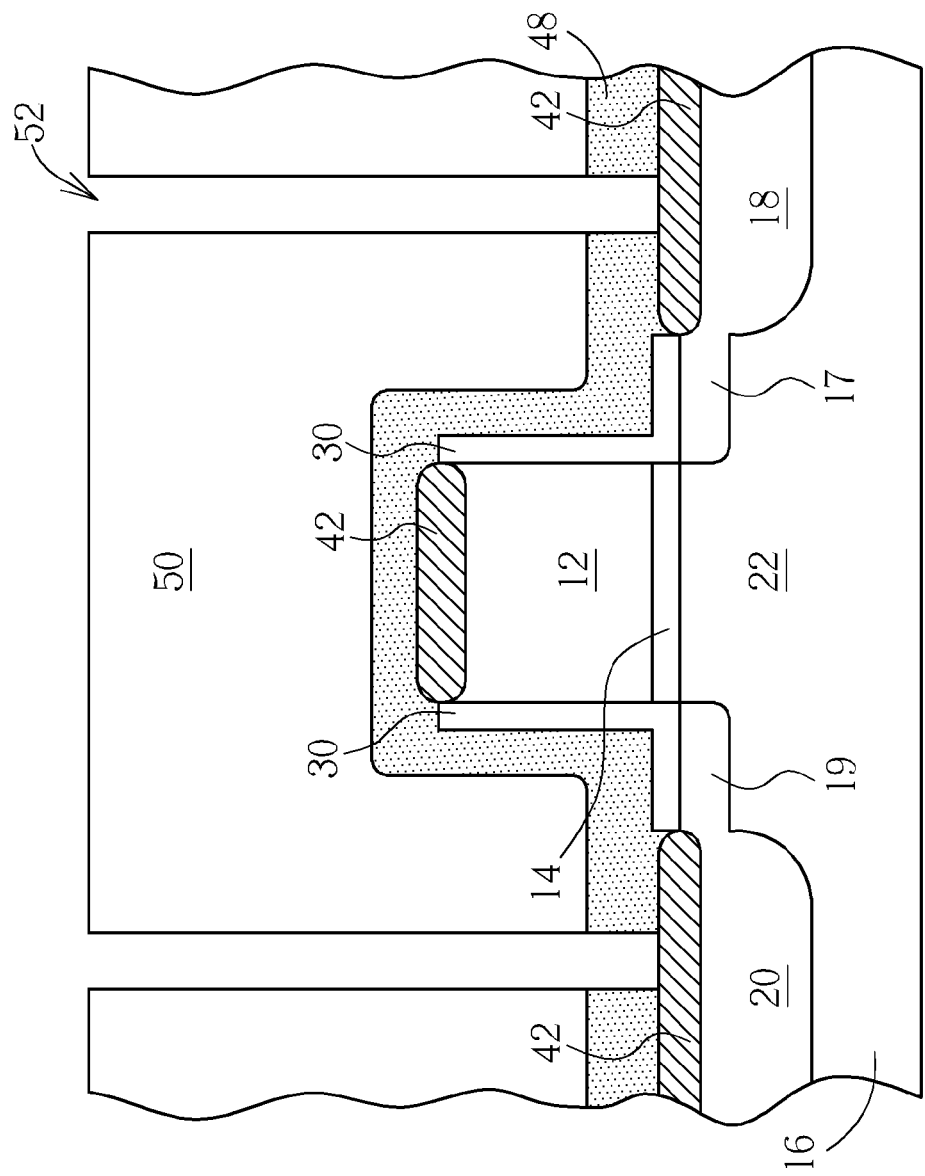
FIG. 8 is a schematic cross-sectional diagram illustrating a MOS transistor device obtained from another embodiment of the manufacturing method according to the present invention.

FIG. 7 shows an embodiment of a MOS transistor device obtained without removing the remained protective layer 44a. FIG. 8 shows another embodiment of the invention, in which, the remained protective layer 44a is removed by, for example, etching before the contact etch stop layer 48 is formed.

Furthermore, after the spacer is removed, or the remained protective layer is removed, an organic polymer layer may be formed on the sidewall of the electrode, the protective layer with the remained thickness, or the material layer (such as the metal silicide layer), which is not harmful to the transistor device.

In comparison with conventional techniques, in the method of the present invention, a protective layer is conveniently deposited on a material layer (such as a salicide layer) on the drain/source region and the gate electrode and a spacer before the spacer is removed. The protective layer is further partially removed such that a portion of the protective layer is remained on the material layer. The material layer is protected by the remained protective layer during the spacer is removed. Thus, the problem of the sheet resistivity encountered in the conventional techniques can be easily resolved. Furthermore, after the spacer is removed, the remained protective layer can be removed or left to combine with the subsequently formed contact etch stop layer. For example, when the protective layer is a silicon nitride layer, and the contact etch stop layer is also a silicon nitride layer, the combination will not affect the structure.

All combinations and sub-combinations of the above-described features also belong to the present invention. Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a metal-oxide-semiconductor transistor device, comprising:

forming a gate electrode on a semiconductor substrate and forming a drain/source region in the semiconductor substrate beside the gate electrode;

forming a spacer on at least one sidewall of the gate electrode;

forming a material layer on top of the drain/source region and the gate electrode;

performing a deposition process to blanketly deposit a protective layer on the material layer and the spacer, such that the protective layer has a first thickness on the spacer and a second thickness on the material layer and the first thickness is less than the second thickness;

performing a first etching process to partially remove the protective layer, such that all the portion of the protective layer on the spacer is substantially removed, and all the portion of the protective layer on the material layer has a remained thickness less than the second thickness;

performing a second etching process to substantially remove all of the spacer;

after performing the second etching process, removing the protective layer having the remained thickness on the material layer; and forming a contact etch stop layer covering the gate electrode and the drain/source region.

2. The method of claim 1, wherein a ratio of the first thickness to the second thickness is less than or equal to 0.9.

3. The method of claim 1, wherein the first thickness of the protective layer on the spacer is approximately zero angstroms.

4. The method of claim 1, wherein the deposition process is performed using a plasma-enhanced chemical vapor deposition (PE CVD) process, a SILPE Base process, or a high-density-plasma chemical vapor deposition (HDP CVD) process.

5. The method of claim 1, wherein the second etching process is performed by a dry etching process.

6. The method of claim 1, wherein the second etching process is performed by a wet etching process.

7. The method of claim 1, wherein the contact etch stop layer is stressed.

8. The method of claim 1, further comprising:

forming an interlayer dielectric layer covering the contact etch stop layer;

performing a third etching process to etch through the interlayer dielectric layer and stop at the contact etch stop layer; and performing a fourth etching process to etch through the contact etch stop layer and expose the drain/source region to form a contact hole.

* * * * *